United States Patent [19]
Takahashi et al.

[11] 4,233,525
[45] Nov. 11, 1980

[54] ELECTRONIC CIRCUIT FOR USE IN A DIGITAL CIRCUIT WHICH PREVENTS PASSAGE OF PULSES HAVING A PULSE WIDTH NARROWER THAN A PREDETERMINED VALUE

[75] Inventors: Yukio Takahashi, Kawasaki; Kazuhiro Toyoda, Yokohama, both of Japan

[73] Assignee: Fujitsu Limited, Japan

[21] Appl. No.: 887,920

[22] Filed: Mar. 17, 1978

[30] Foreign Application Priority Data

Mar. 17, 1977 [JP] Japan .................. 52-29466

[51] Int. Cl.³ .................. H03K 5/01; H03K 5/159; H03K 9/08
[52] U.S. Cl. .................. 307/234; 307/215; 307/268; 328/112
[58] Field of Search .................. 328/110, 111, 112; 307/234, 215, 268

[56] References Cited

U.S. PATENT DOCUMENTS

| 3,036,272 | 5/1962 | Le Vezu | 328/112 |
| 3,198,963 | 8/1965 | Halsted | 307/268 X |
| 3,413,490 | 11/1968 | Breunig et al. | 328/110 X |
| 3,655,998 | 4/1972 | Wilhelm | 307/215 |
| 3,796,831 | 3/1974 | Bauer | 307/234 X |
| 3,970,944 | 7/1976 | Huellwegen | 307/234 X |
| 3,978,347 | 8/1976 | Hollstein et al. | 307/215 |
| 4,061,975 | 12/1977 | Sugai | 328/112 X |
| 4,114,106 | 9/1978 | Martensson | 328/111 |

Primary Examiner—John S. Heyman
Attorney, Agent, or Firm—Staas & Halsey

[57] ABSTRACT

An electronic circuit is used in a digital circuit to prevent the passage of pulses having a pulse width narrower than a predetermined value. According to the present invention, the electronic circuit is composed of a first circuit, having a delay circuit and a first gate with two input terminals, for generating an output when a pulse width of an input pulse is larger than a delay time of the delay circuit, and a second circuit for input pulses of width greater than the delay time which forms an output pulse having a pulse width which is the same as that of the input pulse of the first circuit.

21 Claims, 14 Drawing Figures

ELECTRONIC CIRCUIT FOR USE IN A DIGITAL CIRCUIT WHICH PREVENTS PASSAGE OF PULSES HAVING A PULSE WIDTH NARROWER THAN A PREDETERMINED VALUE

BACKGROUND OF THE INVENTION

1. Field of the Invention

The present invention relates to an electronic circuit which is used in a digital circuit to prevent the passage of pulses having a pulse width narrower than a predetermined value.

2. Description of the Prior Art

In accordance with recent progress in the development of electronic computers, rapid operation is required for a digital circuit, such as memory, which is used in an electronic computer. For the purpose of operating the memory at ultra high speed, the time which is required for selecting an address of the memory, writing information into the memory or reading the information from the memory must be reduced. Therefore, pulses which have a very narrow pulse width, such as for example several nanoseconds, and high speed digital circuits responsive to such pulses are used in recent electronic computers.

When very high speed digital circuits responsive to very narrow signal pulses are used for an electronic computer, the pulse width of the pulses used in the computer approaches that of noise caused by crosstalk in the computer. A minimum pulse width of signal pulses may be selected so that all elements of the digital circuits to which the signal pulses are supplied can be actuated only by pulses having the minimum pulse width. Sensitivities of the elements cannot be made uniform even if all of the elements are formed in an integrated circuit, and some of them are actuated by a pulse having a width narrower than the minimum pulse width. Such unevenness of sensitivities of electronic elements is particularly serious in integrated semiconductor memory devices, and it is therefore desired to avoid such uneven actuation. When noise having a very narrow pulse width is applied to the digital circuits, some elements of the digital circuits may be actuated and the operation of the digital circuits may be disturbed, so that a malfunction may be caused. In the integrated semiconductor memory devices, such a malfunction is apt to happen in the period of a write cycle, because sensitivities of memory cells of the device to write pulses are not uniform. Thus, false information may be written into some of the memory cells by an external noise pulse having a very narrow width.

SUMMARY OF THE INVENTION

An object of the present invention is to provide an electronic circuit for a digital circuit which is used in a very high speed electronic apparatus.

Another object of the present invention is to provide an electronic circuit for use in a digital circuit which prevents the passage of pulses having a pulse width narrower than a predetermined value.

Still another object of the present invention is to provide an electronic circuit which passes a signal pulse but blocks a noise pulse with a pulse width narrower than a predetermined value, and which prevents a malfunction of a very high speed digital circuit.

A further object of the present invention is to provide an electronic circuit for use in an integrated semiconductor memory device which prevents a malfunction of memory cells of the device by a nose pulse.

A still further object of the present invention is to provide an electronic circuit for use in an integrated semiconductor memory device which prevents actuation of the memory cells of the device by an external noise pulse having a very narrow width.

The above-mentioned objects can be achieved by an electronic circuit for use in a digital circuit which prevents the passage of pulses having a pulse width narrow than a predetermined value, the circuit comprising: a first circuit which provides a delay circuit and a first gate having two input terminals, the delay circuit and the gate each receiving an input pulse into said first circuit, and the gate receiving also a delayed pulse corresponding to said input pulse passing said delay circuit. The gate generates an output pulse when said input pulse has a pulse width larger than the delay time corresponding to said delay circuit, and a second circuit which receives the output pulse of said first circuit and forms a pulse having a pulse width which is substantially the same as that of said input pulse of said first circuit when the width of said input pulse is larger than said delay time.

This electronic circuit is connected to an input terminal of a digital circuit so that signal pulses to be supplied to the input terminal pass through the electronic circuit. As a result, the signal pulses can be supplied to the input terminal without reducing the pulse widths, but any external noise pulse having a pulse width narrower than the delay time of the delay circuit is intercepted.

Further features and advantages of the present invention will be apparent from the ensuing description with reference to the accompanying drawings to which, however, the scope of the invention is not limited.

DETAILED DESCRIPTION OF THE PREFERRED EMBODIMENTS

Figure 1:
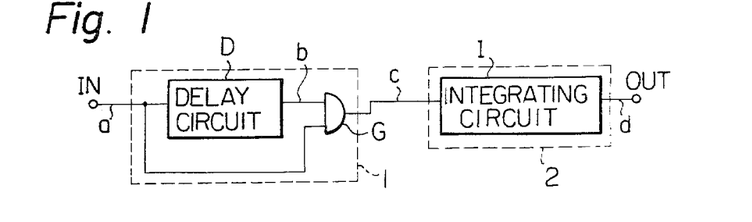
FIG. 1 is a block diagram of an electronic circuit according to the present invention.

Referring to FIG. 1, the electronic circuit according to the present invention is composed of a first circuit 1 and a second circuit 2. The first circuit 1 includes a delay circuit D and an AND gate circuit G, and the second circuit includes an integrating circuit I. The gate circuit G may be another kind of coincidence gate circuit, such as a NAND gate circuit, having two input terminals. Each of the input terminals of the gate circuit is connected to an input terminal of the first circuit and to an output terminal of the delay circuit D, respectively, so that the gate circuit G receives an input pulse IN directly and a delayed pulse of the input pulse passing through the delay circuit D. The delay circuit may comprise at least one logic gate circuit. The first circuit 1 generates an output pulse when the pulse width of the input pulse IN is larger than a predetermined pulse and the second circuit 2 converts the pulse width of the output pulse of the circuit 1 substantially to that of the input pulse. The operation of the electronic circuit illustrated in FIG. 1 is described with positive logic (wherein a high level means logic value "1" and a low level means logic value "0") hereinafter.

Figure 2A:
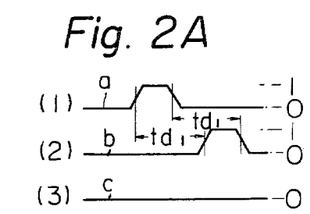
FIGS. 2A and 2B illustrate waveforms of signals in a first circuit in the electronic circuit illustrated in FIG. 1.
Figure 2B:
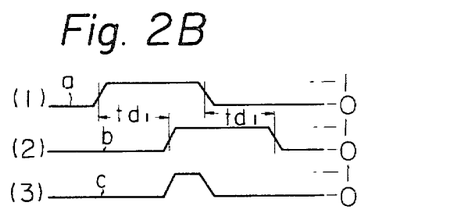
Figure 3:
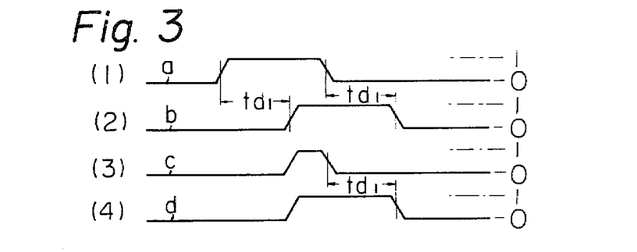
FIG. 3 illustrates waveforms of signals in the first and a second circuit illustrated in FIG. 1.

FIGS. 2A, 2B and 3 illustrate waveforms of the signals in the circuit illustrated in FIG. 1. A delay time $td_1$ of the delay circuit D in FIG. 1 is set so that it is larger than the pulse width time of the noise pulse by which a malfunction may be caused, but smaller than that of the minimum signal pulse width which may be supplied to the input terminal. When a pulse having a pulse width narrower than the delay time $td_1$, as illustrated in (1) of FIG. 2A, is supplied to the input terminal IN in FIG. 1, this pulse is supplied to one input terminal of the gate circuit G and also to the delay circuit D. The output pulse of the delay circuit D, illustrated in (2) of FIG. 2A, is supplied to another input terminal of the gate circuit G. As the output of the delay circuit D is delayed by the delay time $td_1$, as illustrated in FIG. 2A, no output pulse is obtained at the output terminal of the AND gate circuit G. That is, the output of the gate circuit G is a logic value "0", as illustrated in (3) of FIG. 2A. When a pulse having a pulse width substantially larger than the delay time $td_1$, as illustrated in (1) of FIG. 2B, is supplied to the input terminal IN in FIG. 1, this pulse is supplied to one input terminal of the gate circuit G and the pulse delayed the time $td_1$ by the delay circuit D, as illustrated in (2) of FIG. 2B, is supplied to the other input terminal of the gate circuit G. An output pulse having the logic value "1", as illustrated in (3) in FIG. 2B, is then obtained at the output terminal of the AND gate circuit G. The pulse width of the output pulse of the gate circuit G corresponds to a period during which the input pulse, illustrated in (1) of FIG. 2B, and the delayed pulse, illustrated in (2) of FIG. 2B, are overlapped. That is, the pulse width of the output pulse, illustrated in (3) of FIG. 2B, is very narrow and is equal to the difference between the pulse width of the input pulse and the delay time $td_1$ of the delay circuit.

The narrow pulse width of the output pulse of the gate circuit G is changed to the original pulse width of the input pulse by using the second circuit 2, so that any elements of a digital circuit to which the output terminal of the second circuit 2 is connected can be responsive to the output signal pulse from the second circuit 2. By using the integrating circuit in the second circuit 2, a pulse width corresponding to the delay time $td_1$ is added to the output pulse width of the output of the circuit 1, and a pulse having the same pulse width as the input pulse is obtained at the output of the second circuit 2.

Referring to FIG. 3, the first row (1) of FIG. 3 illustrates the input pulse at the point "1" of FIG. 1, the second row (2) of FIG. 3 illustrates the delayed pulse at the point "b" of FIG. 1, the third row (3) of FIG. 3 illustrates the output pulse at the point "c" of FIG. 1, and the fourth row (4) of FIG. 3 illustrates the pulse which has the same pulse width as that of the input pulse and which is obtained at the point "d" of FIG. 1.

Figure 4:
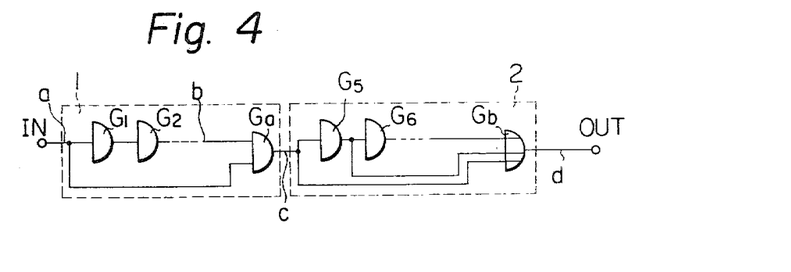
FIG. 4 illustrates a circuit of a first embodiment of the electronic circuit according to the present invention.

The delay circuit D and the integrating circuit I in FIG. 1 may be composed of a logic gate group as illustrated in FIG. 4. Referring to FIG. 4, the first circuit 1 is composed of a group of delay gates $G_1$, $G_2$, . . . and an AND gate $G_a$, and the integrating circuit I is composed of delay gates $G_5$, $G_6$, . . . and an OR gate $G_6$ having plural input terminals. Each of these delay gates $G_1$, $G_2$, . . . and $G_5$, $G_6$, . . . may be a conventional kind of a logic gate circuit, such as an OR or AND gate element having only one input terminal. Furthermore, the delay gates group $G_1$, $G_2$, . . . or $G_5$, $G_6$, . . . can include an even number of inverters. In the first circuit 1 illustrated in FIG. 4, gates $G_1$, $G_2$, . . . are used as the delay element having a predetermined delay time $td_1$, and gates $G_1$, $G_2$, . . . are connected in series for providing the predetermined delay time $td_1$ in total. The gates $G_5$, $G_6$, . . . illustrated in FIG. 4 are also used as the delay element, and the same number of gates $G_5$, $G_6$, . . . , as the gates $G_1$, $G_2$, . . . in the first circuit 1, are connected in series. The output terminals of each of the gates $G_a$, $G_5$, $G_6$, . . . are connected to the input terminals of the OR gate $G_b$.

When the input pulse, as illustrated in the first row (1) of FIG. 3, is applied to one input terminal of the AND gate $G_a$, the delayed pulse, as illustrated in the second row (2) of FIG. 3, is applied to another terminal of the AND gate $G_a$, and the pulse as illustrated in the third row (3) of FIG. 3 is obtained at the output terminal of the AND gate $G_a$. The output of the AND gate $G_a$ is supplies directly to one of the input terminals of the OR gate $G_b$ and is supplied to the input of the delay gate $G_5$. The output of the delay gate $G_5$ is supplied to another input terminal of the OR gate $G_b$ and is also supplied to the delay gate $G_6$. The output of the delay gate $G_6$ is supplied to the other input terminal of the OR gates $G_b$ and an input terminal of a next delay gate. As a result of this, the gates $G_5$, $G_6$, . . . provide a delay time $td_1$ in total and the output pulses of the gate $G_5$, $G_6$, . . . stretch the pulse width of the output pulzse of the gate $G_a$ as much as the delay time $td_1$ through the OR gate $G_b$. Consequently, an output pulse having the same pulse width as that of the input pulse, as illustrated in the fourth row (4) of FIG. 4, is obtained at the output terminal of the OR gate $G_b$. The output of the OR gate $G_b$ is delayed the time $td_1$ with respect to the input of the first circuit 1 with disregard to a delay time by the AND gate $G_a$ and the OR gate $G_b$.

Figure 5:
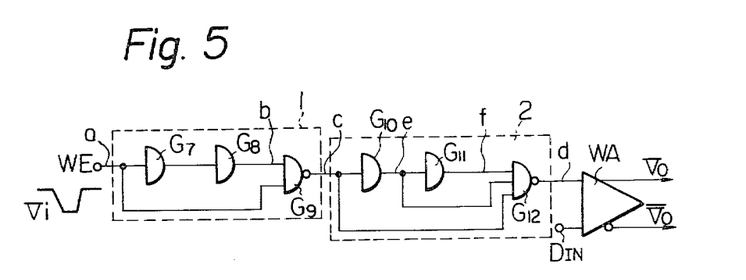
FIG. 5 illustrates a circuit of a second embodiment of the electronic circuit according to the present invention.

FIG. 5 illustrates the circuit of the second embodiment of the electronic circuit which is used in the write circuit of the semiconductor memory device. The delay gates $G_7$, $G_8$, in FIG. 5 may comprise the circuit illustrated in FIG. 6A, the NAND gate $G_9$ may comprise the circuit illustrated in FIG. 6B, the delay gates $G_{10}$, $G_{11}$ may comprise the circuit illustrated in FIG. 6C and the NAND gate $G_{12}$ is constituted as the circuit illustrated in FIG. 6D. These circuits are called ECL (emitter coupled logic) circuits. In these circuits, $Q_1$ through $Q_{15}$ are transistors, $R_1$ through $R_8$ are resistors, $C_1$, $C_2$ are capacitors, i is a constant current source, $V_{CC}$, $V_{EE}$ are source lines, $V_R$ is a reference voltage, $V_{i1}$ through $V_{i3}$ are input terminals and $V_o$ is an output terminal. It should be noted that these circuits can also comprise TTL (transistor transistor logic) circuits instead of ECL circuits. In FIG. 5, $D_{IN}$ is a data input terminal, and $V_o$ are $\overline{V}_o$ are complementary output terminals of a write amplifier WA which are connected to a bit driver (not illustrated in the drawing). WE is an input terminal for receiving a write enable pulse (write pulse) which enables the write amplifier WA to provide output pulses $V_o$ and $\overline{V}_o$ corresponding to a data input signal supplied from the data input terminal $D_{IN}$. The input terminal WE is connected to both the input terminal of the NAND gate $G_9$ and an input terminal of a delay circuit which, comprises the group of delay gates $G_7$ and $G_8$ connected in series. Another input terminal of the NAND gate $G_9$ is connected to an output terminal of the delay circuit comprising the delay gates $G_7$ and $G_8$. The NAND gate provides an output terminal which is connected to one of the input terminals of the second NAND gate $G_{12}$ and to an input terminal of a second delay circuit which comprises the group of delay gates $G_{10}$ and $G_{11}$ connected in series. Each of the other input terminals of the second NAND gate are connected to each of the output terminals of the delay gates $G_{10}$ and $G_{11}$, respectively. The second NAND gate provides an output terminal connected to the input terminal of the write amplifier WA.

The function of the circuit illustrated in FIG. 5 is similar to that illustrated in FIG. 4, however, in the circuit illustrated in FIG. 5, a high level of the input signal $V_i$ corresponds to an information "0" and a low level of the input signal $V_i$ corresponds to an information "1". Namely, the operation of the circuit illustrated in FIG. 5 is described with negative logic hereinafter. Therefore, the AND gate $G_a$ and the OR gate $G_b$ in FIG. 4 are replaced by the NAND gates $G_9$ and $G_{12}$, respectively, FIG. 5. In the circuit illustrated in FIG. 6A, when the input signal $V_i$ is of a high level, the transistor $Q_1$ is "on" and the transistor $Q_2$ is "off". Therefore, the output signal $V_o$ which is obtained at the emitter of the emitter follower transistor $Q_3$, which is used for level shifting, is of a high level. When the input signal $V_i$ is of a low level, the transistor $Q_1$ is "off" and the transistor $Q_2$ is "on", and therefore, the output signal $V_o$ is of a low level. In the circuit illustrated in FIG. 6B, when both input signals $V_{i1}$ and $V_{i2}$ are of a low level, the transistor $Q_4$ and $Q_5$ are "off" and the transistor $Q_6$ is "on", and therefore, the output signal $V_o$ obtained at the emitter of the transistor $Q_7$ is of a high level. When one of the input signals $V_{i1}$ or $V_{i2}$ is of a high level, the transistor corresponding to the high level input is "on" and a voltage drop is caused in the resistor $R_3$, and therefore, the output of the transistor $Q_7$ is of a low level. That is, when the input voltages $V_{i1}$ and $V_{i2}$ are both of a low level (logic value "1"), the output voltage $V_o$ is of a high level (logic value "0"), and when at least one of the input voltages $V_{i1}$ and $V_{i2}$ is of a high level (logic value "0"), the output voltage $V_o$ is of a low level logic value "1"). In the circuit illustrated in FIG. 6B, as the capacitor $C_1$ is connected to the source line $V_{CC}$ and the output terminal $V_o$ parallel to the transistor $Q_7$, a trailing portion of the output signal $V_o$ is obtained.

Figure 6A:
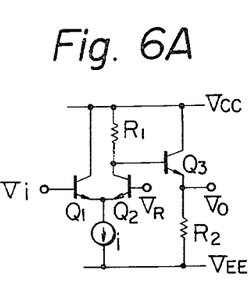
FIGS. 6A through 6D illustrate a gate circuit included in the circuit illustrated in FIG. 5.
Figure 6B:
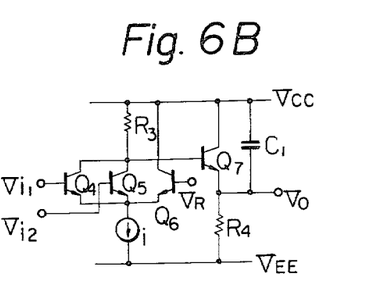
Figure 6C:
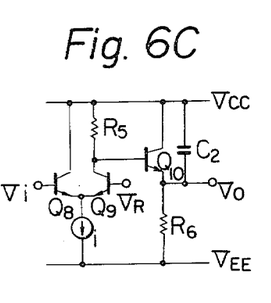
Figure 6D:
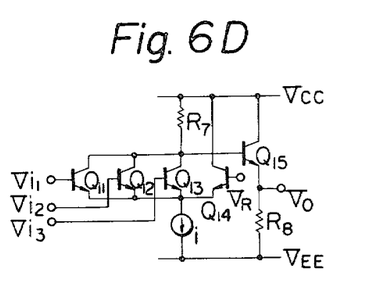

The function of the circuit illustrated in FIG. 6C is similar to that of the circuit illustrated in FIG. 6A. However, the capacitor $C_2$ is connected in parallel to the transistor $Q_{10}$ and a trailing portion of the output signal $V_o$ is obtained. The reason why the capacitors $C_1$ and $C_2$ are used will be explained later. The function of the circuit illustrated in FIG. 6D is similar to that of the circuit illustrated in FIG. 6B, however, as no capacitor is connected in parallel to the transistor $Q_{15}$, the trailing portion of the output signal $V_o$ is the same as that of the input signal $V_i$.

Figure 7:
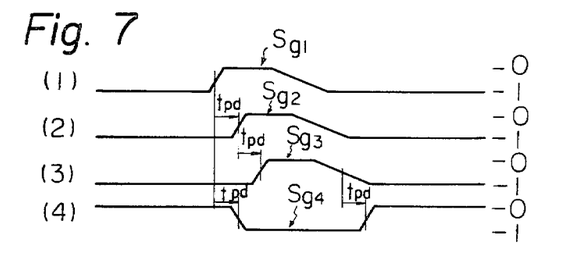
FIG. 7, FIG. 8A and FIG. 8B illustrate waveforms of signals in the circuit illustrated shown in FIG. 5.

The function of the circuit illustrated in FIG. 5 will now be explained with reference to the waveforms of the signal illustrated in FIG. 7. The operation of the first circuit 1 illustrated in FIG. 5 is similar to that in FIG. 1, however, the logic value of the output signal of the first circuit 1 in FIG. 7 corresponding to the input signal $V_i$ is an reverse of that in FIG. 1. When the input signal $V_i$, having a pulse width larger than the total delay time $2tpd$ of the delay gates $G_7$ and $G_8$, is supplied to the input terminal WE in FIG. 5, a signal $Sg_1$, as illustrated in (1) of FIG. 7, is obtained at the output terminal of the NAND gate circuit $G_9$. This signal $Sg_1$ corresponds to the waveform (3) of FIG. 3, except that this signal $Sg_1$ has a trailing portion when a circuit with a capacitor such as shown in FIG. 6B is used for the NAND gate $G_9$. This signal $Sg_1$ is delayed by the gates $G_{10}$ and $G_{11}$ of the second circuit 2, as illustrated in (2) and (3) of FIG. 7. The signal $Sg_1$ and the delayed signals $Sg_2$ and $Sg_3$ are supplied to the NAND gate circuit $G_{12}$, and the output signal $Sg_4$ illustrated in (4) of FIG. 7 is obtained at the output terminal of the NAND gate $G_{12}$. The waveforms (1), (2), (3) and (4) of FIG. 7 are obtained at the points c, e, f and d of the second circuit illustrated in FIG. 5. In the circuit illustrated in FIG. 5, we assume that the signal propagation time in the NAND gate circuit $G_{12}$ is also the time tpd. The signal $Sg_4$ illustrated in (4) of FIG. 7 corresponds to the signal (4) of FIG. 3.

Figure 8A:
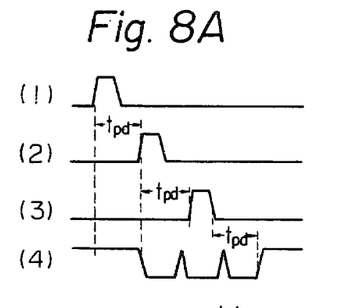
Figure 8B:
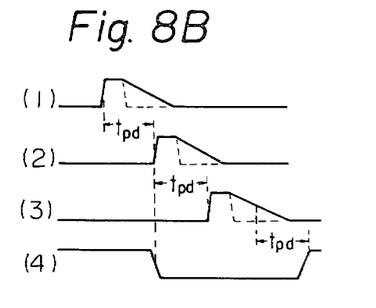

FIG. 8A illustrates the waveforms obtained in the circuit illustrated in FIG. 5, when the capacitors $C_1$ and $C_2$ are not provided in the NAND gate $G_9$, and in the delay gates $G_{10}$, $G_{11}$. As the output of the NAND gate $G_9$ has a pulse width which is equal to the difference between the input signal $V_i$ and the total delay time $2tpd$ at the delay gates $G_7$ and $G_8$, when the pulse width of the input pulse $V_i$ is nearly equal to the delay time $2tpd$, the pulse width of the output of the NAND gate $G_9$ is very small. If the pulse width of the output of the NAND gate $G_9$ is narrower than the delay time tpd of the delay gates $G_{10}$ or $G_{11}$, as illustrated in (1) of FIG. 8A, an intermittent output of the NAND gate circuit $G_{12}$ is caused as illustrated in (4) of FIG. 8A. If the capacitors $C_1$ and $C_2$ are provided in the NAND gate $G_9$ and in the delay gates $G_{10}$, $G_{11}$, the intermittent output illustrated in (4) of FIG. 8A can be removed, as illustrated in (4) of FIG. 8B. In FIG. 8B, waveforms (1), (2), (3) and (4) correspond to the waveforms (1), (2), (3) and (4) of FIG. 8A, which are obtained at the point c, e, f, d in FIG. 5, respectively.

In practice, a delay time in the delay gates $G_{10}$ and $G_{11}$ should be designed slightly larger than the total delay time $2tpd$ of the delay gates $G_7$ and $G_8$, because, even if a pulse having a pulse width slightly larger than the delay time $2tpd$ is supplied to the input terminal of the electronic circuit, the NAND gate circuit $G_9$ cannot be actuated and no output pulse is generated at the output terminal of the electronic circuit.

The electronic circuit according to the present invention can be used, for example, in an integrated semiconductor memory device having a large amount of memory cells.

Figure 9:
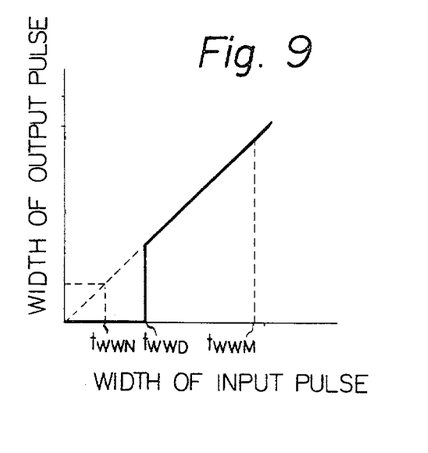
FIG. 9 is a diagram showing the relation between the pulse width of an input pulse and that of an output pulse of the electronic circuit according to the present invention.

Assuming that the minimum widths of pulses which enable the writing of information into each memory cell in the semiconductor memory device are distributed over 1 through 4 nanoseconds, the electronic circuit according to the present invention having a total delay time of, for example, 2.5 nanoseconds at the delay gates group in the first or second circuit, can be used. The pulse width of a write pulse is set to more than 4 nanosecond, for example 5 nanoseconds, and this write pulse is applied to the memory cells through the electronic circuit of the present invention. Therefore, an external noise pulse having a pulse width less than 2.5 nanoseconds, which might be able to write false information into some of the memory cells, is intercepted by the electronic circuit, while no write information pulses are affected. Referring to FIG. 9, $t_{WWM}$ is the pulse width by which all memory elements can be written and $t_{WWN}$ is the pulse width by which no memory element can be written. If write pulses having a pulse width between $t_{WWM}$ and $t_{WWN}$ are used, some memory elements can be written, however, other memory elements cannot be written. The lowest limit $t_{WWN}$ of the pulse width is determined by the circuit and pattern design. When a very small value is settled as the lowest limit $t_{WWN}$ of the pulse width, the memory elements are written by a very narrow noise pulse, so that malfunction of the memory device is caused. When the highest limit for $t_{WWM}$ is selected, the rapidity of the memory device is lost. In the present invention, as a threshold of the pulse width, that is, the delay time $t_{WWD}$, a value slightly smaller than the value $t_{WWM}$ is used. Therefore, the write amplifier WA receives only input signals having a pulse width larger than $t_{WWD}$ and a malfunction due to the noise pulse having a pulse width less than $t_{WWD}$ can be avoided. In a practical memory device wherein the value $t_{WWN}$ is 1 nanosecond and the value $t_{WWM}$ is 4 nanoseconds, a typical parameter of the gate circuits illustrated in FIG. 6A through 6D which constitute the electronic circuit illustrated in FIG. 5 is as follows.

Voltages of the source lines $V_{CC}$ and $V_{EE}$ are zero and $-5.2$ volts respectively, a high level of a logic signal equalling $-0.85$ volt through $-0.9$ volt and a low level equalling $-1.6$ volts through $-1.7$ volts. The reference voltage $V_R$ is selected to be $-1.3$ volts under this condition. In the gate circuit $G_7$, $G_8$ of FIG. 6A, resistance values of the resistors $R_1$ and $R_2$ are selected to be 800 ohms and 4 kilo-ohms, respectively, and a current value of the constant current source i is set up to be 1 milliamp. In the NAND gate circuit $G_9$ of FIG. 6B, the resistance values of the resistors $R_3$ and $R_4$ are selected to be 400 ohms and 8 kilo-ohms, respectively, a capacitance value of the capacitor $C_1$ is selected to be 0.5 picofarad, and a current value of the constant current source i is set up to be 2 milliamp. In the gate circuit $G_{10}$ or $G_{11}$ of FIG. 6C, the resistance values of the resistors $R_5$ and $R_6$ are selected to be 550 ohms and 8 kilo-ohms, respectively, a capacitance value of the capacitor $C_2$ is selected to be 0.5 picofarad, and a current value of the current source i is set up to be 1.5 milliamp. In the second NAND gate $G_{12}$ of FIG. 6D, the resistance values of the resistors $R_7$ and $R_8$ are selected to be 400 ohms and 4 kilo-ohms and a current value of the constant current source i is set up to be 2 milliamp.

Each of the gate circuits illustrated in FIGS. 6A trough 6D provides a delay time of 0.7 through 1 nanosecond. A trailing portion of an output pulse from the output terminal $V_0$ of the gate circuits $G_9$, $G_{10}$ and $G_{11}$ illustrated in FIGS. 6B and 6C, is stretched by a fall time of as muchas 0.5 nanoseconds in comparison with that of the gate circuits $G_7$, $G_8$ and $G_{11}$, illustrated in FIGS. 6A and 6D.

Consequently, this electronic circuit provides the delay time $t_{WWD}$ of about 2.5 nanoseconds, and intercepts an external noise pulse having a pulse width less than about 2.5 nanoseconds.

In the circuit according to the present invention, a noise pulse having a pulse width more than the value $t_{WWD}$ cannot be intercepted, and therefore, no precaution is taken with respect to noise having a wide pulse width. However, noise having a wide pulse width does not arise as a practical matter in an electronic apparatus such as the electronic computer, because the noise pulses in such an apparatus is mainly caused by crosstalk.

Furthermore, the electronic circuit according to the present invention delays the write pulse and, therefore, a write operation of a memory cell by the write pulse is delayed as compared with the input of the electronic circuit. However, this delay of the write operation is not a problem for a succession of write operations of memory cells, because the period of one write cycle is not increased by the electronic circuit.

As mentioned above, according to the present invention, an electronic circuit through which only a pulse having a pulse width larger than a predetermined value can pass and which can be simply constituted can be provided. By using such an electronic circuit, only write pulses having a pulse width larger than a predetermined value can be supplied to the rapid semiconductor memory device, and therefore, a malfunction due to noise can be avoided.

What is claimed is:

1. An electronic circuit for use in a digital circuit to prevent the passage of pulses having pulse width narrower than a predetermined value and for preserving the pulse width of transmitted pulses, said electronic circuit comprising:

a first circuit for receiving an input pulse, said first circuit comprising a delay circuit and a first gate having two input terminals, one of said two input terminals of said first gate comprising means for receiving said input pulse to said first circuit and the other of said two input terminals comprising means for receiving a delayed pulse corresponding to said input pulse as a result of passing through said delay circuit, said gate of said first circuit further comprising means for generating an output pulse of said first circuit when said input pulse has a pulse width larger than a predetermined delay time corresponding to said delay circuit;

a second circuit comprising means for receiving the output pulse of said first circuit and for forming a pulse having a pulse width which is substantially the same as that of said input pulse of said first circuit when said input pulse has a pulse width larger than that corresponding to said predetermined delay time, said means of said second circuit comprising:

a second gate, and a group of first delay gates connected in series, the total delay time of said group of first delay gates being substantially the same as said predetermined width value, and the output of said first circuit and of each said first delay gates being input to said second gate.

2. An electronic circuit according to claim 1, said first gate comprising an AND gate circuit.

3. An electronic circuit according to claim 1 said first gate comprising a NAND gate circuit.

4. An electronic circuit according to claim 1 said delay circuit comprising at least one logic gate circuit.

5. An electronic circuit according to claim 1 wherein said delay circuit comprises a group of second delay gates which are connected in series, the total delay time of said second delay gates being the same as said predetermined delay time.

6. An electronic circuit according to claim 1, said second gate is comprising an OR gate circuit.

7. An electronic circuit according to claim 1, said second gate comprising a NAND gate circuit.

8. An electronic circuit according to claim 2, said AND gate comprising a capacitor for providing said output pulse of said first circuit with a trailing portion.

9. An electronic circuit according to claim 3, said NAND gate comprising a capacitor for providing said output pulse of said first circuit with a trailing portion.

10. An electronic circuit according to claim 1, each of said first delay gates comprising a capacitor for providing the output of each said first delay gate with a trailing portion.

11. The circuit of claim 3, said delay circuit comprising n delay gates, and said NAND gate comprising n+1 emitter coupled transistors connected to a constant current source, and an output transistor having its base connected in common to the collectors of n of said n+1 emitter coupled transistors and its emitter connected to said output of said NAND gate.

12. The circuit of claim 4, each said at least one logic gate circuit comprising two transistors with their emitters commonly connected to a constant current source and an output transistor having its base connected to the collector of one of said two transistors and its emitter connected to the output of the corresponding logic gate circuit.

13. The circuit of claim 7, said group of first delay gates comprising n delay gates, said NAND gate circuit of said second gate comprising n+2 transistors with each of their emitters connected in common with a constant current source, and an output transistor having its base connected in common to the collectors of n+1 of said n+2 transistors, the emitter of said output transistor providing said pulse having a width substantially the same as that of said input pulse.

14. The circuit of claim 1, each of said first delay gates comprising
   two transistors with their emitters commonly connected to a constant current source, and
   an output transistor having its base connected to the collector of one of said two transistors and its emitter connected to the corresponding output of each said first delay gate.

15. The circuit of claim 11, 12, 13 or 14, each said gate comprising a delay time from 0.7 to 1 nanosec.

16. The circuit of claim 11 or 14 comprising a capacitor connected across said output transistor to provide a trailing edge on the output signal of the corresponding said output, said trailing edge having a corresponding time period of up to approximately 0.5 nanosec.

17. An electronic circuit for use in a semi-conductor memory device comprising:

a first input terminal for receiving a circuit input pulse,
a first delay circuit comprising an input terminal connected to said first input terminal and an output terminal, said first delay circuit having a corresponding first delay time,
a first gate comprising two input terminals and an output terminal, one of said two input terminals being connected to said first input terminal and the other being connected to said output terminal of said first delay circuit, said first gate and said first delay circuit comprising further means for generating a first output pulse on said output terminal of said first gate when an input pulse is supplied to said first input terminal with a pulse width larger than a predetermined delay time corresponding to said first delay circuit,
a second delay circuit comprising an input terminal connected to said output terminal of said first gate and having at least two output terminals,
a second gate comprising a plurality of input terminals, one of said input terminals of said second gate being connected to said output terminal of said first gate and at least two other of said plurality of input terminals of said second gate being connected to said at least two output terminals of said second delay circuit, said second delay circuit and said second gate further comprising means for providing a second output pulse having a pulse width which is substantially the same as that of said circuit input pulse when said circuit input pulse has a pulse width greater than said predetermined delay time, and
said second delay circuit comprising a group of second delay gates connected in series, the total delay time of said group of second delay gates being the same as that of said predetermined width value, each of said second delay gates having an output terminal connected to one of said input terminals of said second gate.

18. An electronic circuit according to claim 17 wherein each of said first and second gates is composed of a NAND gate circuit.

19. An electronic circuit according to claim 17, each of said first and second delay circuits comprising at least one ECL gate circuit.

20. An electronic circuit according to claim 17, said first delay circuit comprising a group of second delay gates connected in series, the total delay of said second delay gates being the same as said first delay time.

21. The circuit of claim 1 or 17, the number of said second delay gates being equal to the number of said first delay gates.

* * * * *

UNITED STATES PATENT AND TRADEMARK OFFICE
CERTIFICATE OF CORRECTION

PATENT NO. : 4,233,525  Page 1 of 2
DATED : November 11, 1980
INVENTOR(S) : Takahashi et al.

It is certified that error appears in the above—identified patent and that said Letters Patent is hereby corrected as shown below:

Front page, [56], References Cited, line 11, "Martensson"
    should be --Mårtensson--;
        [57], Abstract, line 8, after "than", "a" should
    be --the--.
Column 1, line 17, after "as" insert --a--.
Column 2, line 2, "nose" should be --noise--;
      *line 52, after ";" insert --and--.
Column 3, line 39, "(3) in" should be --in (3) of--;
      line 62, ""1"" should be --"a"--.
Column 4, line 39, "pulzse" should be --pulse--;
      line 65, "are" should be --and--.
Column 5, line 6, after "which" delete --,--;
      line 39, "transistor" should be --transistors--;
      *line 59, after "$C_1$" delete --,--.
Column 6, line 45, "point" should be --points--;
      *line 67, "second," should be --seconds,--.
Column 7, line 11, after "written" change "," to --;--;
      *line 23, after "and" change "a" to --the--;
      *line 24, "the" should be --a--;

UNITED STATES PATENT AND TRADEMARK OFFICE
CERTIFICATE OF CORRECTION

PATENT NO. : 4,233,525

DATED : November 11, 1980

INVENTOR(S) : Takahashi et al.

It is certified that error appears in the above—identified patent and that said Letters Patent is hereby corrected as shown below:

```
           line 28, "FIG." should be --FIGS.--;
           line 56, "trough" should be --through--.
Column 8,  line 43, after "circuit;" insert --and--;
           line 60, after "1" insert --,--;
           line 62, after "1" insert --,--;
           line 64, after "1" insert --,--.
Column 9,  line 2, delete "is";
           line 39, after "comprising" insert --:--.
Column 10, line 41, after "17" insert --,--;
           line 42, delete "wherein".
```

Signed and Sealed this

Twenty-eighth Day of April 1981

[SEAL]

Attest:

RENE D. TEGTMEYER

Attesting Officer

Acting Commissioner of Patents and Trademarks